United States Patent
Kunze et al.

(10) Patent No.: US 11,782,115 B2
(45) Date of Patent: Oct. 10, 2023

(54) IMAGE RECONSTRUCTION METHOD

(71) Applicant: Siemens Healthcare GmbH, Erlangen (DE)

(72) Inventors: Karl-Philipp Kunze, London (GB); Radhouene Neji, London (GB)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/729,425

(22) Filed: Apr. 26, 2022

(65) Prior Publication Data

US 2022/0349976 A1 Nov. 3, 2022

(30) Foreign Application Priority Data

Apr. 29, 2021 (GB) .................................... 2106154

(51) Int. Cl.
*G01R 33/565* (2006.01)
*G01R 33/56* (2006.01)

(52) U.S. Cl.
CPC ... *G01R 33/56509* (2013.01); *G01R 33/5608* (2013.01)

(58) Field of Classification Search
None
See application file for complete search history.

(56) References Cited

U.S. PATENT DOCUMENTS

| | | | |
|---|---|---|---|
| 11,360,178 B2* | 6/2022 | Botnar | G06T 11/005 |
| 2014/0121496 A1* | 5/2014 | Bi | G01R 33/56325 |
| | | | 600/413 |
| 2014/0301622 A1* | 10/2014 | Forman | G01R 33/5676 |
| | | | 382/131 |
| 2015/0015691 A1* | 1/2015 | Forman | A61B 5/055 |
| | | | 348/77 |
| 2019/0317172 A1 | 10/2019 | Botnar et al. | |

(Continued)

OTHER PUBLICATIONS

Cruz, Gastao et al:"Highly efficient nonrigid motion-corrected 3D whole-heart coronary vessel wall imaging"; Magnetic Resonance in Medicine; vol. 77; 2017; pp. 1894-1908; URL: https://www.ncbi.nlm.nih.gov/pmc/articles/PMC5412916/pdf/MRM-77-1894.pdf; 2017.

(Continued)

*Primary Examiner* — Rodney E Fuller
(74) *Attorney, Agent, or Firm* — Harness, Dickey & Pierce, P.L.C.

(57) ABSTRACT

A computer-implemented method of reconstructing a motion-compensated magnetic resonance image uses raw k-space data acquired at a first resolution over successive respiratory and/or cardiac cycles of a patient. After binning data based on corresponding motion states derived from these cycles, the resolution of the binned K-space data in each bin is reduced. This is done by selecting a sub-group of binned k-space data. Bin images are reconstructed from the reduced-resolution data, and histogram-equalised versions of the reconstructed reduced-resolution bin image generated for each bin. Motion fields are estimated and interpolated to the first resolution such that motion data can be incorporated into a final reconstruction of a motion compensated image.

20 Claims, 6 Drawing Sheets

(56) References Cited

U.S. PATENT DOCUMENTS

2023/0010419 A1\* 1/2023 Kunze ............... G01R 33/5611

OTHER PUBLICATIONS

C. Prieto et al., "Highly efficient respiratory motion compensated free-breathing coronary MRA using golden-step Cartesian acquisition," J. Magn. Reson. Imaging, vol. 41, No. 3, 2015.

Batchelor P. G. et al. "Matrix description of general motion correction applied to multishot images" in Magnetic Resonance in Medicine 54 (2005), pp. 1273-1280.

Munoz, Camila et al: "Motion corrected water/fat whole-heart coronary MR angiography with 100% respiratory efficiency"; Magnetic Resonance in Medicine; vol. 82; pp. 732-742; URL: https://www.ncbi.nlm.nih.gov/pmc/articles/PMC6563440/pdf/MRM-82-732.pdf; 2019; 2019.

Correia Teresa et al. "Optimized Respiratory-resolved Motion-compensated 3D Cartesian Coronary MR Angiography" in Magnetic Resonance in Medicine 2018; pp. 2618-2629.

A. Bustin et al., "Five-minute whole-heart coronary MRA with sub-millimeter isotropic resolution, 100% respiratory scan efficiency, and 3D-PROST reconstruction," Magn. Reson. Med., vol. 0, No. 0, Jul. 2018.

Kalyani, Jagriti et al., "Contrast Enhancement of MRI Images using Histogram Equalization Techniques"; 2020 International Conference on Computer; Electrical & Communication Engineering (ICCECE); 2020; pp. 1-5; XP033841297; DOI: 10.11.09/ICCECE48148.2020.9223088; 2020.

Feng, Li et al. "XD-GRASP: Golden-Angle Radial MRI with Reconstruction of Extra Motion-State Dimensions Using Compressed Sensing", Magnetic Resonance in Medicine, 2016, vol. 75, pp. 775-788.

Munoz, Camila et al: "Motion-corrected 3D wholeheart water-fat high-resolution late gadolinium enhancement cardiovascular magnetic resonance imaging"; Journal of Cardiovascular Magnetic Resonance; 2020; vol. 22; No. 5 3; pp. 1-13; URL: https://jcmr-online.biomedcentral.com/track/pdf/10.1186/s12968-020-00649-5.pdf; 2020.

Glitzner, M. et al: "Online 3D motion estimation using low resolution MRI"; Physics in Medicine and Biology; vol. 60; Aug. 6, 2015; pp. 1-10; DOI: 10.1088/0031-9155/60/16/N301; 2015.

\* cited by examiner

IMAGE RECONSTRUCTION METHOD

CROSS-REFERENCE TO RELATED APPLICATION(S)

The present application claims priority under 35 U.S.C. § 119 to Great Britain Patent Application No. GB 2106154.4, filed Apr. 29, 2021, the entire contents of which are incorporated herein by reference.

FIELD

Embodiments of the present invention relate to a method of image reconstruction, for example, a computer-implemented method of reconstructing a motion-compensated magnetic resonance image of a patient.

BACKGROUND

Magnetic resonance imaging (MRI) is used frequently in medical applications as a diagnostic and staging tool. A patient is exposed to a static magnetic field BO and an incident pulsed RF (radio-frequency) signal, which excite the nuclear spin energy transition in hydrogen atoms present in water and fat in the body. Magnetic field gradients are used to localise the resulting magnetisation in space, leading to the generation of an image. Varying the parameters of the pulse sequence used to excite the nuclear spin energy transition creates different contrasts between tissues due to the relaxation properties of the hydrogen atoms. Such imaging techniques are used in neurological, cardiovascular, musculoskeletal and gastrointestinal investigations, as well as angiography. Images may or may not be obtained with the use of contrast agents, such as gadolinium, to highlight features of interest.

In cardiovascular imaging one major issue encountered in the reconstruction of images obtained using MRI is the handling of motion corruption. Typically, MRI acquisition relies on the patient remaining very still, which for scans of limbs or the spine, for example, is likely to be sufficient to ensure the acquisition of an uncorrupted image. However, in cardiovascular imaging motion compensation is a key topic as cardiac motion and/or respiratory motion can create corruption within the final MRI image. To attempt to minimise this, there are several stages in the overall process of handling motion corruption. The first is to synchronise the acquisition of data with the cardiac rhythm of the patient. This is illustrated further in FIG. 1.

Figure 1:
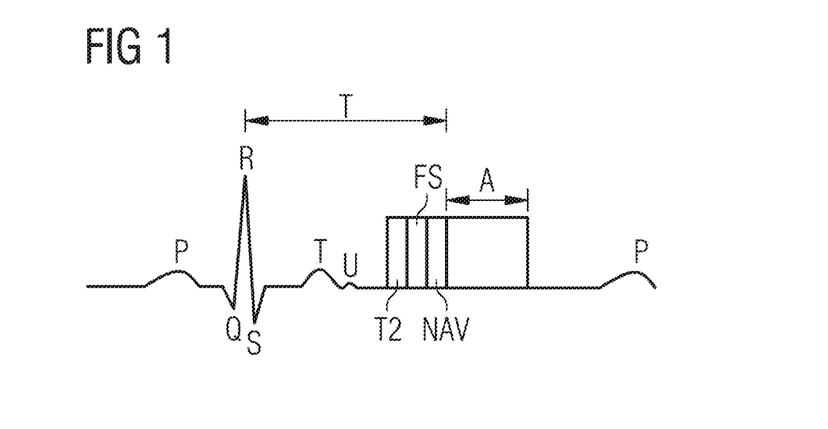
FIG. 1 is a schematic illustration of the synchronisation of image acquisition with a cardiac rhythm as measured using an ECG (electrocardiogram)

FIG. 1 is a schematic illustration of the synchronisation of image acquisition with a cardiac rhythm as measured using an ECG (electrocardiogram). No data is acquired during the phase represented by the P, Q, R, S, T and U waves, with high resolution three-dimensional data in k-space acquired between the U wave and the P wave of the next heartbeat. This is known as the acquisition window A. Prior to the acquisition window A is a trigger delay T, which spans the time between the R wave and the beginning of the acquisition window A. Immediately prior to the start of the acquisition window A a number of pulses may occur: e.g. a T2 preparation pulse (T2-weighted scans highlight the differences in transverse relaxation time from the nuclear spin energy transition between tissue types); a fat saturation pulse FS (to suppress fat signal in the image); and a two-dimensional image navigator window iNAV (to enable tracking of image features in the image reconstruction phase). Successive images are acquired from consecutive acquisition windows timed in accordance with the patient's ECG, leading to a k-space representation of the image data. k-space represents the spatial frequency information of an object in two or three dimensions. It is defined by the space covered by the phase and frequency encoding data and may be transformed into image data by use of a Fourier transform, potentially in combination with iterative and/or regularised reconstruction algorithms.

This process of reconstruction may comprise various corrections to the data to take into account the cardiac and/or respiratory motion. This can be done using motion-compensated reconstruction algorithms, following a succession of steps, each of which may be time consuming. Usually the k-space data is first binned along directions of motion, which requires determining a series of motion states for the patient based upon the respiratory and/or cardiac cycle and grouping k-space data within each motion state together in a data bin. Secondly, the k-space data in each bin may be reconstructed into an individual motion state image, which can be used in a third step to estimate the motion between each individual motion state reconstructed in the second step by registration of the images representing each binned motion state. Finally, a reconstruction of all data, including the motion information estimated in step three, may be carried out. This is typically done either by including the motion information into the MRI encoding operator, or, in the case of a regularised reconstruction, into a regularisation term. Regularisation may be carried out to stabilise the reconstruction of potentially highly undersampled k-space data.

Figure 2A:
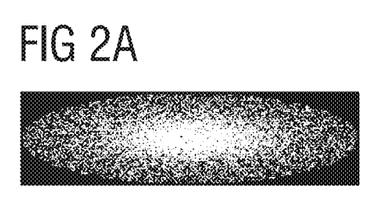
FIGS. 2A and 2B show k-space plots for an undersampled three-dimensional data acquisition for all data samples and for a single bin, respectively.
Figure 2B:
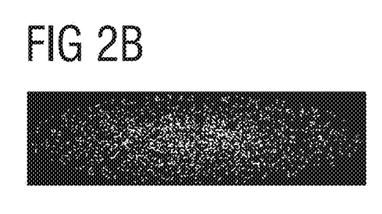

However, there are difficulties in carrying out this method, notably with steps two and three, which are tightly connected. Binned data is often highly undersampled, such that the reconstruction of individual motion states is prone to artefacts and time-consuming. This is illustrated in FIG. 2, which shows a k-space plot for an undersampled three-dimensional data acquisition for all data samples in FIG. 2a, and for a single bin in FIG. 2b. The data acquisition was carried out using an ECG-gated, variable density spiral-like Cartesian trajectory (VD-CASPR) with an acceleration factor of 3.75. That means that only a fraction of 1/3.75 of the whole k-space data has been acquired to speed up the acquisition, and while cardiac motion is frozen due to the ECG-gating, the data contains a number of different respiratory states of the patient. For a commonly used, pre-defined number (e.g. five) of respiratory motion states, the single bin in FIG. 2b represents only one fifth of the samples, resulting in an effective acceleration factor of 3.75×5=18.75 for that bin. Attempting to reconstruct images of the binned data based on such highly undersampled data is very challenging and will often lead to suboptimal image quality even when strong regularisation is employed. This potentially insufficient image quality of the individual motion states (bins) can then greatly impact the subsequent step of estimating the motion between the motion states. This may be due to a low signal-to-noise ratio, a high level of undersampling artefacts, and/or a trade-off between the fidelity of the motion states versus the stability of the reconstruction, for example, when using regularisation between motion states during reconstruction. Additionally, given that the step of estimating the motion between the binned motion states often involves registration using an intensity-based metric of similarity, for images having uneven image histograms (a graphical representation of the tonal distribution in the reconstructed image) the dynamic range of signal from regions of interest may be significantly decreased by other intense signals, such as unsuppressed fat signals in the chest. Finally, the estimation of motion information across all motion states at the higher image resolution used for diagnostic purposes is computationally intensive, which hinders its application in a clinical setting.

Approaches to deal with such issues are known. For example, strategies such as (XD)-GRASP (golden angle radial MRI) attempt to solve the reconstruction of motion states using smoothness constraints across the motion states in an iterative fashion. However, this leads to long reconstruction times and suffers from high undersampling of individual bins combined with a limit to the achievable strength of regularisation whilst maintaining the fidelity of the motion states. XD-ORCCA (optimised respiratory resolved Cartesian cardiac magnetic resonance angiography) employs a rigid alignment of the organ of interest across all motion bins before regularisation, which provides quantitative estimates of rigid motion between bins. Another alternative strategy is so-called soft-binning. This is where the reconstruction of each individual motion state involves the pooled data from all states, with a penalty weight applied according to some measure of distance between each data point and the respective motion state centre. While soft-binning approaches decrease reconstruction time by avoiding iterative regularisation, fidelity of motion states is usually reduced due to the pooling of data. And whilst approaches to histogram equalisation do exist, since these involve the redistribution of intensity values they are inherently prone to amplifying noise and image artefacts, the latter being commonly abundant in the case of bin images reconstructed from highly undersampled data as described above. Therefore, rather than improving the reconstruction of the image such an approach can be ineffective or even detrimental overall.

SUMMARY

The inventors have identified a need for an image reconstruction method that takes into account the respiratory and/or cardiac motion of a patient and produces accurate diagnostic images at a high quality and reduced computing cost.

Embodiments of the present invention aim to address these issues, by providing, in a first aspect, a computer-implemented method of reconstructing a motion-compensated magnetic resonance image of a patient, comprising: a) acquiring, at a first resolution, initial raw k-space data of a magnetic resonance image of a patient over successive respiratory and/or cardiac cycles; b) grouping the acquired raw k-space data, or a subset of the raw k-space data, into one or more bins, wherein each bin represents a motion state at a specific point in the respiratory and/or cardiac cycle of the patient; c) selecting a sub-group of binned k-space data from each bin and reconstructing a bin image from the selected sub-group of binned k-space data for each bin, the sub-group of binned k-space data having a reduced resolution compared to the first resolution; d) generating histogram-equalised versions of the reconstructed reduced-resolution bin image for each bin from the sub-group of binned k-space data, and estimating the motion between the histogram-equalised images in the form of motion fields; and e) incorporating the interpolated motion fields into a final reconstruction of a motion compensated image of the patient, taking into account all, or a subset, of the acquired raw k-space data.

The use of a reduced resolution approach results in reconstructed motion state images with inherently higher signal-to-noise ratio compared with motion state images reconstructed at the initial first resolution. Also, since the reduced-resolution bin images exhibit a lower effective acceleration factor than the binned k-space data sampled at the first resolution, motion state images will be less prone to artifacts and require less regularisation, which in turn will lead to a higher fidelity of these images to the actual motion states.

Preferably, the step of acquiring raw k-space data of a magnetic resonance image comprises acquiring the images during an acquisition window timed using an electrocardiogram of the patient.

Preferably, the raw k-space data of a magnetic resonance image of a patient is one of a series of images that require registration with each other to create a final magnetic resonance image of a patient.

The step of selecting a sub-group of binned k-space data may comprise resampling the binned k-space data to reduce the resolution of the binned k-space data by a pre-determined percentage based on an initial resolution of the binned k-space data. Alternatively, the step of selecting a sub-group of binned k-space data may comprise resampling the k-space data to reduce the resolution of the binned k-space data to the minimum resolution at which physiological features of interest are resolvable. Further alternatively, the step of selecting a sub-group of binned k-space data may comprise resampling the k-space data to reduce the resolution by rejecting or zero-padding a variable number high-frequency samples in the binned k-space data.

Preferably, the step of generating a histogram-equalised image comprises increasing the global contrast of the reconstructed bin image.

Preferably, the step of forming a motion field for each bin comprises distorting each reduced-resolution reconstructed image onto a reduced-resolution reconstructed image generated from binned k-space data in an adjacent bin to create a vector field representing the distortion.

Preferably, the step of incorporating the motion fields further comprises the step of interpolating the estimated motion fields to the first resolution. Preferably, the step of reconstructing the image further comprises taking into account estimates of translation motion between bins.

Preferably, the raw k-space data is undersampled.

Preferably, the raw k-space data is acquired using a variable density trajectory imaging method, such that the sub-groups of binned k-space data, from which the reduced resolution images for each bin are reconstructed, exhibit a lower relative undersampling than the first resolution of the initial raw k-space data Preferably, the motion-compensated image of the patient contains cardiac and/or vascular information.

In a second aspect, embodiments of the present invention also provide a data processing apparatus adapted to reconstruct a motion-compensated three-dimensional magnetic resonance image of a patient, comprising: an imaging device adapted to acquire, at a first resolution, an initial raw k-space data of a magnetic resonance image of a patient over successive respiratory and/or cardiac cycles; and a processor adapted to group the acquired raw k-space data, or a subset of the k-space data, into one or more bins, wherein each bin represents a motion state at a specific point in the respiratory and/or cardiac cycle of the patient; select a sub-group of binned k-space data from each bin and reconstruct a bin image from the selected sub-group of binned k-space data for each bin, the sub-group of binned k-space data having a reduced resolution compared to the first resolution; generate histogram-equalised versions of the reconstructed bin image for each bin from the sub-group of binned k-space data, and estimate the motion between the histogram-equalised images in the form of motion fields; and incorporate the interpolated motion fields into a final reconstruction of a motion compensated image of the patient, taking into account all, or a subset, of the acquired raw k-space data.

In a third aspect, embodiments of the present invention also provide a computer program product comprising instructions which, when executed by a computer, cause the computer to carry out the steps of the method outlined above.

BRIEF DESCRIPTION OF THE DRAWINGS

The present invention will now be described by way of example only, and with reference to the accompanying drawings, in which.

DETAILED DESCRIPTION

Unlike techniques that result in a rigid motion compensation or use weighting or image histogram manipulation, embodiments of the present invention offer a computer-implemented reconstruction method that results in a non-rigid motion compensated reconstructed image of a patient. Initially, the initial raw k-space data of a magnetic resonance image of a patient is acquired, at a first resolution, over successive respiratory and/or cardiac cycles. This raw k-space data is then grouped, or a subset of the k-space data is grouped, into one or more bins. Each bin represents a specific point in the respiratory and/or cardiac cycle of the patient. Next, a sub-group of the binned k-space data having a reduced resolution compared with the first resolution, is selected from each bin, and a bin image of the patient is reconstructed. At this point, histogram-equalised versions of the reconstructed image for each bin are generated, and the motion between the histogram-equalised images is estimated in the form of motion fields. Finally, the estimated motion fields are incorporated into a final reconstruction of a motion compensated image of the patient, taking into account all, or the subset, of the acquired raw k-space data.

Figure 3:
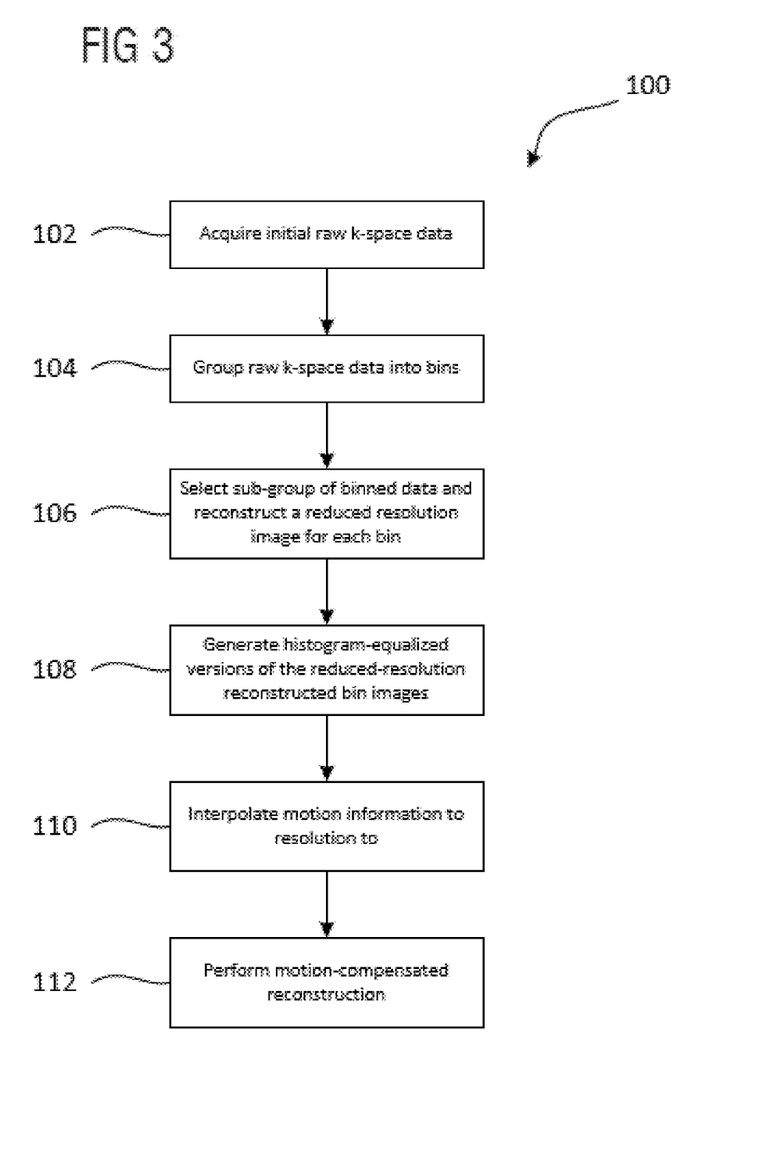
FIG. 3 is a flowchart illustrating a computer-implemented method of reconstructing a motion-compensated magnetic resonance image of a patient in accordance with embodiments of the present invention.

FIG. 3 is a flowchart illustrating a computer-implemented method of reconstructing a motion-compensated magnetic resonance image of a patient in accordance with embodiments of the present invention. The method 100 comprises a number of steps, which together result in a non-rigid motion compensation of images such as those used in cardiology and may be employed in any situation where the raw k-space data exhibits regions of signal intensity inhomogeneity from, for example, undersampling or residual unsuppressed fat signal. Initially, at step 102, the initial raw k-space data of a magnetic resonance image of a patient is acquired over successive respiratory and/or cardiac cycles. Preferably this is motion-corrupted/free-breathing two-dimensional or three-dimensional MRI data, acquired with a variable-density trajectory, using a technique such as VD-CASPR. This means that the density of the samples in k-space increases towards the centre of k-space. It may be desirable for this step to be performed during an acquisition window timed using an electrocardiogram of the patient. The raw k-space data is acquired at a first resolution.

At step 104, the raw k-space data, or a subset of the raw k-space data is grouped into one or more bins, where each bin represents a specific point in the respiratory and/or cardiac cycle of the patient. By separating out the raw k-space data into n bins, the effective acceleration factor for the binned k-space data within each bin will be the acceleration factor for the data acquisition multiplied by n. For example if five bins are used, for raw k-space data acquisition with an acceleration factor of 3.75, the binned k-space data in each bin has an effective acceleration factor of 3.75×5=18.75.

At step 106, a sub-group of binned k-space data in each bin is selected, where the sub-group has a reduced resolution compared with the first resolution of the raw k-space data. Preferably, this comprises re-sampling the binned k-space data in each bin to reduce the resolution by a pre-determined percentage based on the first resolution of the raw k-space data. Alternatively, the re-sampling of the binned k-space data in each bin is done to reduce the resolution to the minimum resolution at which the motion of relevant physiological features of interest is resolvable. One way to reduce the resolution of the binned k-space data is by rejecting or zero-padding a number of high-frequency samples in the binned k-space data in each bin. The number of such high-frequency samples may be variable, that is varied between bins or acquisitions. It may also be desirable to determine the reduced resolution based upon a preferred processing time. The reconstruction is carried out iteratively to produce a reduced-resolution reconstructed bin image of the patient. This may be done either with or without regularisation, or with weak regularisation across motion states, which may also take into account estimates of translational motion between bins.

Once the reduced-resolution bin image has been reconstructed, at step 108 histogram-equalised versions of the reduced-resolution reconstructed bin image for each bin are generated from the sub-group of binned k-space data, and the motion between the histogram-equalised images is estimated in the form of motion fields. Generating a histogram-equalised image is done by increasing the global contrast of the reduced-resolution reconstructed bin image. Forming a motion field for each bin comprises distorting each reduced-resolution reconstructed image onto a reduced-resolution reconstructed image generated from binned k-space data in an adjacent bin to create a vector field representing the distortion. Since the motion fields are vector fields, this distortion can be achieved by placing the reduced-resolution reconstructed images in registration to retrieve the motion information.

At this point it may be desirable to interpolate the motion information to the resolution at which the final motion-compensated reconstruction will be performed and the final image of the patient obtained. The final image resolution may be the same as the initial resolution. This takes place at step 110. Finally, at step 112, a motion-compensated reconstruction is performed, taking into account all of, or if a subset was used, the subset, of the acquired raw k-space data. This is done by incorporating the motion information either into an MRI encoding operator, or into a regularisation constraint across all motion states. Inclusion into an MRI encoding operator is of the form:

$$E = \Sigma_b A_b F S_c U_b$$

Where E is the encoding operator, Ab is the sampling pattern (for all bins b), F is a Fourier operator, Sc represents complex coil sensitivities, and Ub are the motion fields (for all bins b).

Figure 4:
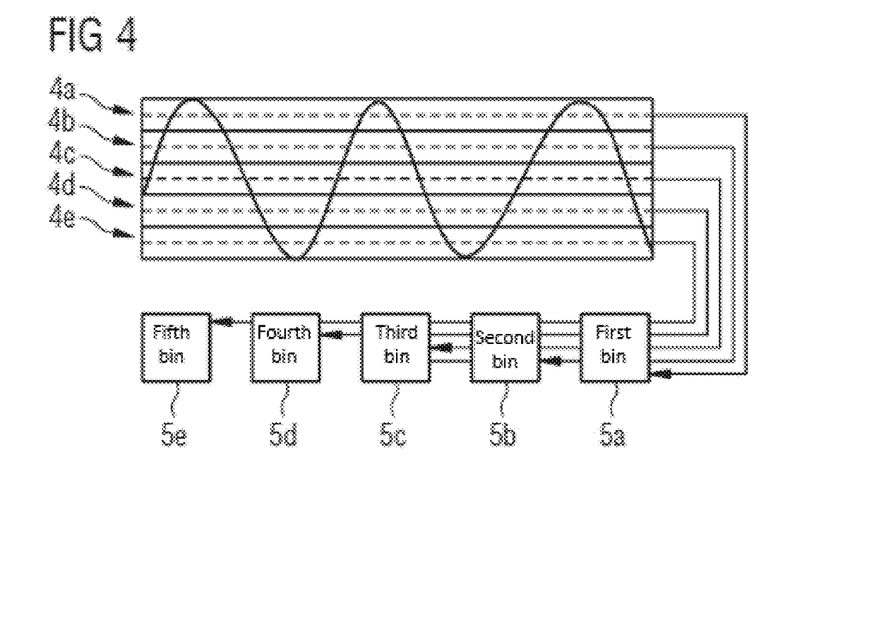
FIG. 4 is a schematic illustration of the separation of respiratory motion into a number of bins.

As mentioned above, the number of bins is determined by the number of motion states, where each state is a specific point in the respiratory and/or cardiac cycle of the patient. This is illustrated in further detail in FIG. 4. FIG. 4 is a schematic illustration of the separation of respiratory motion into a number of bins. The respiratory signal 1 is in the form of a quasi-sinusoidal curve, with a number of peaks 2 and troughs 3. The amplitude of the respiratory signal 1 between the peaks 2 and the troughs 3 is divided into a number of equally-sized or equally-populated ranges, in this example, five ranges are chosen but this may be varied as required. Each range contains a centre point, and a bin is created for each range, so that raw k-space data falling within each range from successive parts of the respiratory cycle will be placed in the same bin. Therefore, for the first range 4a, data is placed into a first bin 5a, for the second range 4b, data is placed into a second bin 5b, and so on. Each bin therefore represents a distinct and discrete motion state.

Figure 5A:
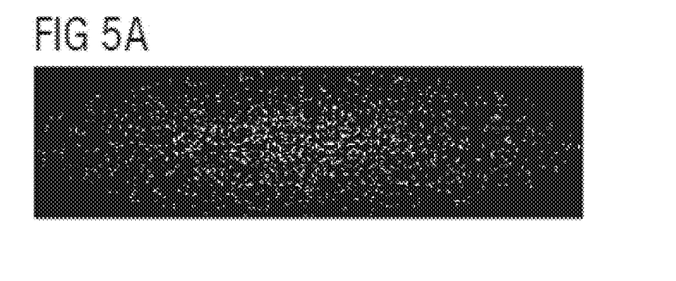
FIGS. 5A and 5B are illustrations of the reduction in resolution of the binned k-space data.
Figure 5B:
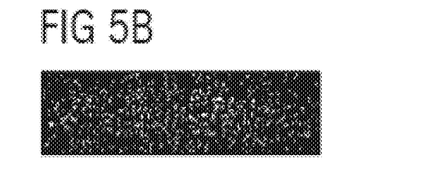

FIG. 5 is an illustration of the reduction in resolution of the binned k-space data. As in FIG. 2, the data acquisition was carried out using a variable density spiral-like Cartesian trajectory (VD-CASPR) with an acceleration factor of 3.75. The single bin A represents one fifth of the original samples, resulting in an effective acceleration of 3.75×5=18.75. The reduced resolution data in bin B is the same single binned k-space data as bin A but at half the resolution. This is equivalent to using the central 50% of the original binned k-space data in single bin A in both partition- and phase-encoding dimensions. However, given that the sampling density is greater towards the centre of k-space, the effective acceleration factor for bin B is only 7.9.

Figure 6:
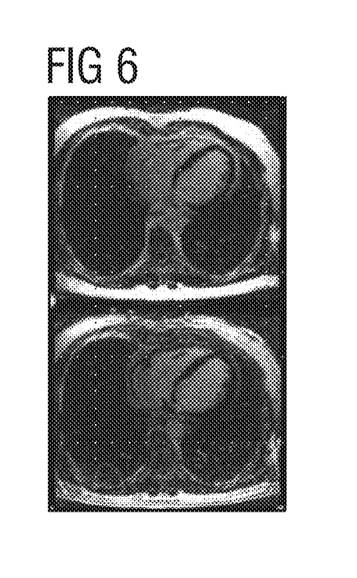
FIG. 6 shows two MR images obtained in-phase and out-of-phase using Dixon imaging techniques in a Late Gadolinium Enhancement (LGE) scan.
Figure 7:
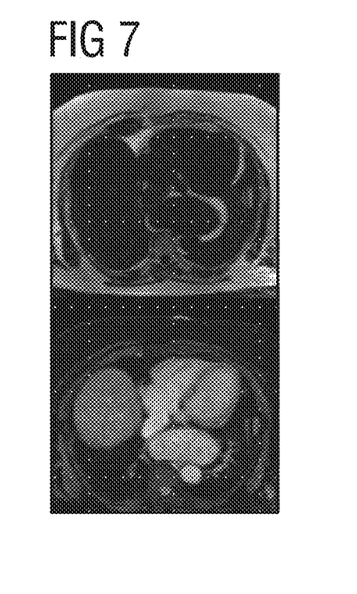
FIG. 7 shows a fat-only MR image and a water-only MR image.

One application where the methods in accordance with embodiments of the present invention find use is in motion correction in undersampled k-space data or data in which there is residual unsuppressed fat signal. Both of these situations result in regions within the reconstructed image that have regions of varied image intensity, which may distort clinical findings or obscure features of interest. As an example of this, the following deals with Dixon imaging, where rather than using a radio-frequency (RF) pulse for fat suppression during acquisition, as illustrated in FIG. 1, the original images contain signals from both water and fat. Water and fat within the human body contain protons having a slight difference in their resonance frequencies during the nuclear spin resonance excitation process. This causes the proton spins for water and fat to go in and out-of-phase with each other as a function of time. The period of the phase cycling is 1/M, where M is the frequency offset between the two proton spins. In-phase and out-of-phase conditions therefore occur twice per cycle. In Dixon imaging, two sets of images are acquired with slightly different echo times: one with the fat and water signals in-phase, and one with the echo time adjusted slightly such that the fat and water signals are out-of-phase. Using specific post-processing algorithms, it is then possible to combine the in-phase and out-of-phase images to produce fat-only images and water-only images, with the water-only images being fat suppressed. These images are shown in FIGS. 6 and 7. FIG. 6 shows two MR images obtained in-phase and out-of-phase using Dixon imaging techniques in a Late Gadolinium Enhancement (LGE) scan, and Figure shows a fat-only MR image and a water-only MR image.

Figure 8:
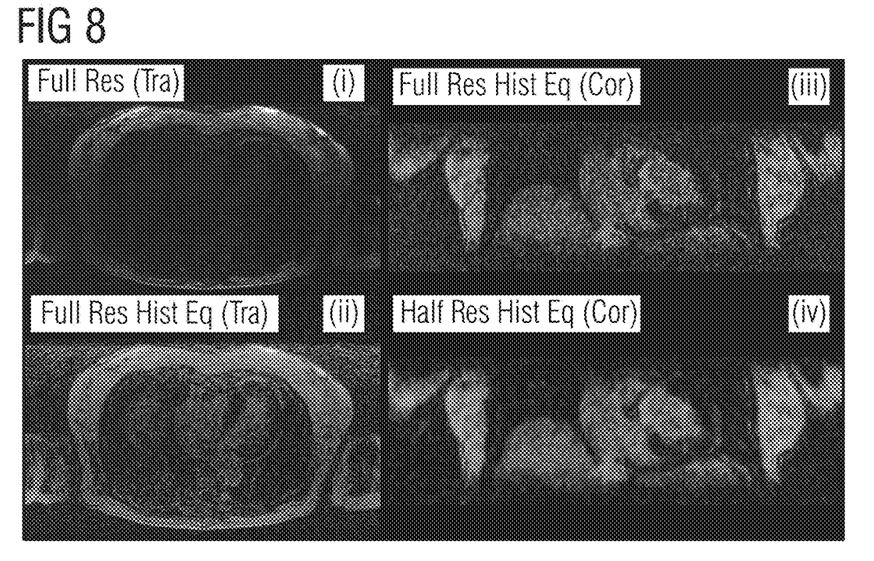
FIG. 8 shows four images generated from the single bin A and reduced-resolution bin B of FIG. 5 in combination with histogram equalisation.

Turning back to the embodiments of the present invention, FIG. 8 shows four images generated from the single bin A and reduced-resolution bin B of FIG. 5 in conjunction with histogram equalisation. These images show Dixon gradient echo out-of-phase images reconstructed using the XD-ORCCA technique. The two left-hand views, (i) and (ii) show the effect of (i) a full resolution transverse image reconstructed from bin A and (ii) histogram equalisation of the same full resolution transverse image. The two right-hand views (iii) and (iv) show the effect of (iii) histogram equalisation of the coronal view and (iv) histogram equalisation of the half-resolution coronal bin image reconstructed from bin B. Whilst histogram equalisation of the full resolution transverse and coronal images show regions of increased intensity, they are also affected by noise and artefacts, as marked by the arrows. For example, an increased intensity region outside the body of the patient can be seen in (ii), and all regions in (iii) exhibit increased intensity. However, the image in (iv) reconstructed from the k-space data in bin B shows much greater contrast between regions of high and low intensity, and higher quality of the region of interest, i.e., in this case, the heart.

Figure 9A:
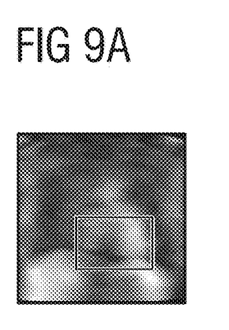
FIGS. 9A-9D are comparisons between cardiac images in which there is no motion compensation, translational (rigid) motion compensation and non-rigid motion compensation in accordance with embodiments of the present invention.
Figure 9B:
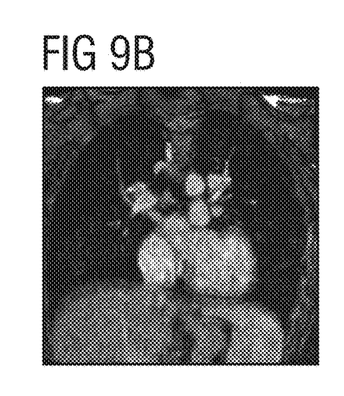
Figure 9C:
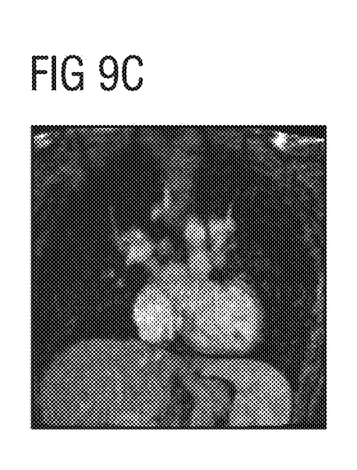
Figure 9D:
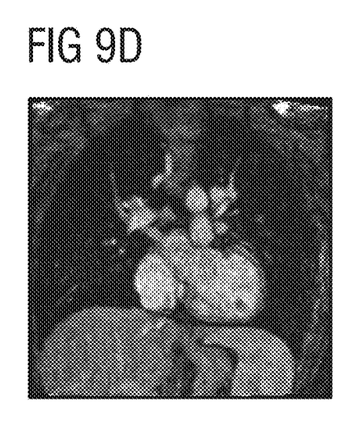

The combination of the reduced resolution binning and histogram equalisation steps of the embodiments of the present invention represents an improved non-rigid motion compensation when compared with existing techniques. FIG. 9 is a comparison between cardiac images in which there is no motion compensation, only translational (rigid) motion compensation and non-rigid motion compensation in accordance with embodiments of the present invention. The image navigator tracking window, as obtained in the triggering phase of the data acquisition, is shown in white, in FIG. 9(a). FIG. 9(b) shows a reconstructed image with no motion compensation. The regions in the lower and mid diaphragmatic areas show poor resolution, with only the vasculature in the upper chest region exhibiting sufficient quality. FIG. 9(c) shows a reconstructed image in which translational motion correction has been applied based on the positioning of the tracking window in FIG. 9(a). Whilst this has improved the resolution of the mid diaphragmatic area directly corresponding to the position of the tracking window, the resolution of the lower diaphragmatic area and the vasculature of the upper chest area are worse than with no motion correction. FIG. 9(d) shows an image reconstructed using the non-rigid motion compensation technique of the method 100 in accordance with embodiments of the present invention. All regions of the image show increased sharpness and improved contrast when compared with FIG. 9(b) where no motion compensation has been carried out.

Figure 10:
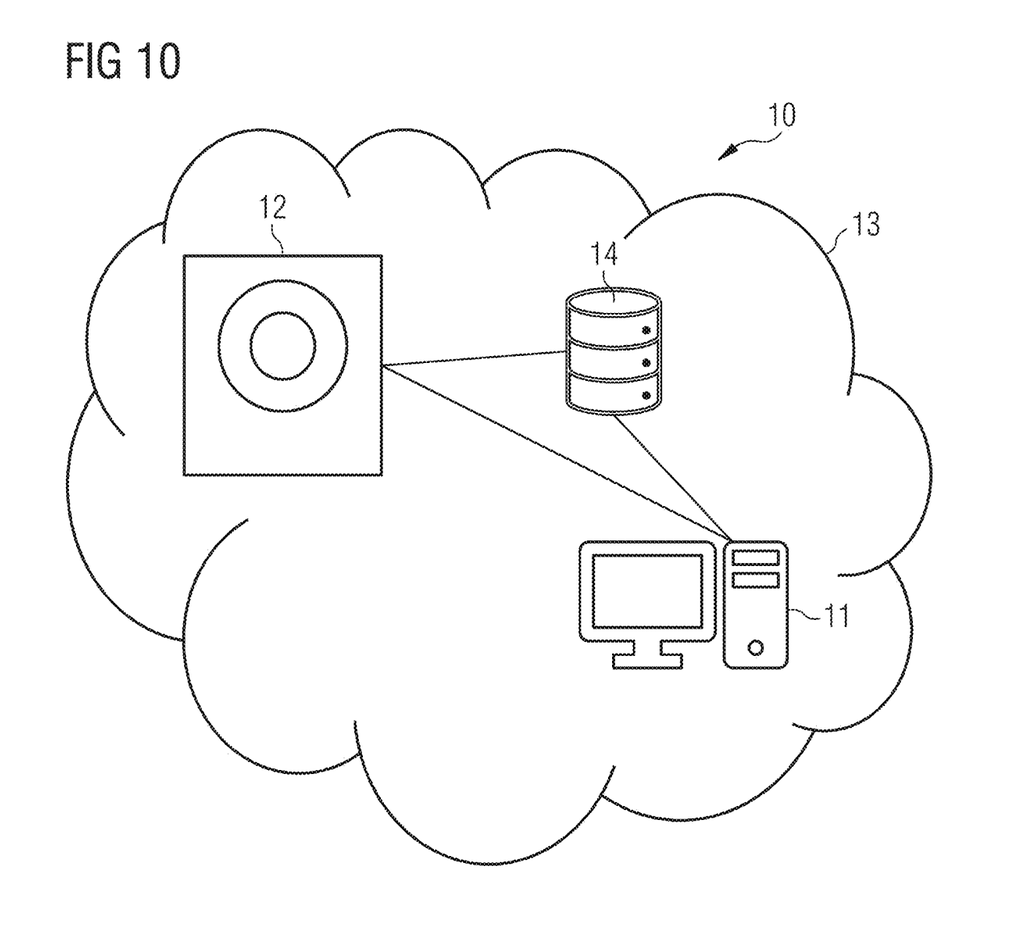
FIG. 10 is a schematic representation of a data processing apparatus adapted to reconstruct a motion-compensated magnetic resonance image of a patient in accordance with embodiments of the present invention.

FIG. 10 is a schematic representation of a data processing apparatus adapted to reconstruct a motion-compensated magnetic resonance image of a patient in accordance with embodiments of the present invention. The data processing apparatus 10 comprises a processor 11 that is adapted to receive information from an imaging device 12. The imaging device 12 is adapted to acquire, at a first resolution, initial raw k-space data of a magnetic resonance image of a patient over successive respiratory and/or cardiac cycles. For this purpose, the imaging device 12 may also comprise ECG apparatus (not shown) to enable timing of the acquisition window in each cardiac cycle, and apparatus to monitor breathing (also not shown) to determine the patient's respiratory cycle. Although the processor 11 may be directly linked to the imaging device 12 via a wired or wireless data connection, for example, via a communications network 13, data storage 14 is also provided. The data storage 14 may be configured to store raw data directly from the imaging device 12 to be retrieved by the processor 11 when required and is therefore available via the communications network 13 for this purpose. The data storage 14 may also be used to store data during the execution of method steps from the method 100 described above. The processor 11 is therefore adapted to receive or retrieve the initial raw (k-space) data acquired by the imaging device 12. The processor is also adapted to carry out the steps 104 to 112 of the method 100. In addition, a computer program product, comprising instructions which, when executed on a computer such as the data processing system 10, cause the data processing system 10 to carry out the steps of the method 100.

Whilst in the examples above the binning process has been carried out with all of the raw k-space data acquired it may be desirable to select only a subset of the raw k-space data for binning and subsequent re-sampling, for example in order to reject outliers according to respiratory motion. The benefits of the embodiments of the present invention are numerous. The reconstruction of motion states from the reduced-resolution reconstructed bin images inherently results in a higher signal-to-noise ratio than those reconstructed from full resolution reconstructed bin images. The use of a variable density trajectory in the raw k-space data acquisition leads to a reduction in image artefacts since the individual motion state k-spaces have a lower effective acceleration factor. Reduced resolution motion states also result in a lower effective acceleration factor, such that lower regularisation factors can be used during image reconstruction. In turn, this means that the motion states themselves have a higher fidelity. The reconstruction of reduced resolution motion state images may be up to an order of magnitude faster than using the original resolution. For example, the matrix size of a half resolution three-dimensional motion state image is $(½)3=⅛$ of the original, first, resolution matrix. The combined effects of an increased signal-to-noise ratio and lower artefact levels enable the use of histogram equalisation far more successfully than in previous methods. Since carrying out simultaneous registration of image features having differing intensity levels in different images is complex, utilising histogram equalisation successfully simplifies this task. Image registration executed on the basis of reduced-resolution images is significantly faster than with images having the original resolution, and also less prone to errors resulting from noise or undersampling artefacts.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although the present invention has been disclosed in the form of embodiments and variations thereon, it will be understood that numerous additional modifications and variations could be made thereto without departing from the scope of the present invention.

What is claimed is:

1. A method of reconstructing a motion-compensated magnetic resonance image of a patient, the method comprising:
    acquiring, at a first resolution, initial raw k-space data of a magnetic resonance image of a patient over at least one of successive respiratory or successive cardiac cycles of the patient;
    grouping the initial raw k-space data, or a subset of the initial raw k-space data, into one or more bins, wherein each of the one or more bins represents a motion state at a specific point in at least one of a respiratory or cardiac cycle of the patient;
    selecting a sub-group of binned k-space data from each of the one or more bins and reconstructing a reduced-resolution bin image from the sub-group of binned k-space data for each of the one or more bins, the one or more reduced-resolution bin images having a reduced resolution compared to the first resolution;
    generating histogram-equalized versions of the one or more reduced-resolution bin images, reconstructed for the one or more bins from the sub-group of binned k-space data, and estimating motion between the histogram-equalized versions in a form of motion fields; and
    incorporating the motion fields into a final reconstruction of the motion-compensated magnetic resonance image of the patient, taking into account at least a subset of the initial raw k-space data.

2. The method as claimed in claim 1, wherein the acquiring initial raw k-space data of the magnetic resonance image comprises:
    acquiring images during an acquisition window timed using an electrocardiogram of the patient.

3. The method as claimed in claim 1, wherein the initial raw k-space data of the magnetic resonance image of the patient is one of a series of images that require registration with each other to create a final magnetic resonance image of a patient.

4. The method as claimed in claim 1, wherein the selecting a sub-group of binned k-space data comprises:
resampling the binned k-space data to reduce a resolution of the binned k-space data by a percentage based on the first resolution of the initial raw k-space data.

5. The method as claimed in claim 1, wherein the selecting a sub-group of binned k-space data comprises:
resampling the binned k-space data to reduce a resolution of the binned k-space data to a minimum resolution at which physiological features of interest are resolvable.

6. The method as claimed in claim 1, wherein the selecting a sub-group of binned k-space data comprises:
resampling the binned k-space data to reduce a resolution by rejecting or zero-padding a variable number high-frequency samples in the binned k-space data.

7. The method as claimed in claim 1, wherein the generating histogram-equalized versions of the one or more reduced-resolution bin images comprises:
increasing a global contrast of the one or more reduced-resolution bin images.

8. The method as claimed in claim 1, further comprising:
forming a motion field for each of the one or more bins by distorting each of the one or more reduced-resolution bin images onto a reduced-resolution reconstructed bin image generated from binned k-space data in an adjacent bin to create a vector field representing the distortion.

9. The method as claimed in claim 1, wherein reconstructing the one or more reduced-resolution bin images further comprises:
taking into account estimates of translation motion between the one or more bins.

10. The method as claimed in claim 1, wherein the incorporating the motion fields comprises:
interpolating the motion fields to the first resolution.

11. The method as claimed in claim 1, wherein the initial raw k-space data is undersampled.

12. The method as claimed in claim 1, wherein the initial raw k-space data is acquired using a variable density trajectory imaging method, such that the sub-groups of binned k-space data, from which the one or more reduced-resolution bin images for the one or more bins are reconstructed, exhibit a lower relative undersampling than the first resolution of the initial raw k-space data.

13. The method as claimed in claim 1, wherein the initial raw k-space data comprises a residual unsuppressed fat signal.

14. The method as claimed in claim 1, wherein the initial raw k-space data is acquired using Dixon imaging.

15. The method as claimed in claim 1, wherein the motion-compensated magnetic resonance image of the patient contains at least one of cardiac or vascular information.

16. A non-transitory computer-readable storage medium storing computer-executable instructions that, when executed by a computer, cause the computer to carry out the method of claim 1.

17. A data processing apparatus adapted to reconstruct a motion-compensated magnetic resonance image of a patient, the data processing apparatus comprising:
an imaging device configured to acquire, at a first resolution, initial raw k-space data of a magnetic resonance image of a patient over at least one of successive respiratory or successive cardiac cycles of the patient; and
a processor configured to
group the at least a subset of the initial raw k-space data into one or more bins, wherein each of the one or more bins represents a motion state at a specific point in at least one of a respiratory or cardiac cycle of the patient,
select a sub-group of binned k-space data from each of the one or more bins and reconstruct a reduced-resolution bin image from the selected sub-group of binned k-space data for each of the one or more bins, the one or more reduced-resolution bin images having a reduced resolution compared to the first resolution,
generate histogram-equalized versions of the one or more reduced-resolution bin images, reconstructed for the one or more bins from the sub-group of binned k-space data, and estimate motion between the histogram-equalized versions in a form of motion fields, and
incorporate the motion fields into a final reconstruction of the motion-compensated magnetic resonance image of the patient, taking into account all, or a subset, of the initial raw k-space data.

18. The data processing apparatus as claimed in claim 17, wherein the initial raw k-space data of the magnetic resonance image of the patient is one of a series of images that require registration with each other to create a final magnetic resonance image of a patient.

19. The data processing apparatus as claimed in claim 17, wherein the processor is configured to select the sub-group of binned k-space data by resampling the binned k-space data to reduce a resolution of the binned k-space data by a percentage based on the first resolution of the initial raw k-space data.

20. The data processing apparatus as claimed in claim 17, wherein the processor is configured to select the sub-group of binned k-space data by (i) resampling the binned k-space data to reduce a resolution of the binned k-space data to a minimum resolution at which physiological features of interest are resolvable, or (ii) resampling the binned k-space data to reduce the resolution by rejecting or zero-padding a variable number high-frequency samples in the binned k-space data.

* * * * *